(12) United States Patent
Lee

(10) Patent No.: US 10,868,023 B2
(45) Date of Patent: Dec. 15, 2020

(54) NON-VOLATILE MEMORY ARRAY

(71) Applicant: DB HITEK CO., LTD., Seoul (KR)

(72) Inventor: Jun Ho Lee, Yongin-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/265,301

(22) Filed: Feb. 1, 2019

(65) Prior Publication Data

US 2019/0244967 A1 Aug. 8, 2019

(30) Foreign Application Priority Data

Feb. 2, 2018 (KR) .................... 10-2018-0013240

(51) Int. Cl.
*H01L 27/11521* (2017.01)
*H01L 29/788* (2006.01)
(Continued)

(52) U.S. Cl.
CPC ...... *H01L 27/11521* (2013.01); *H01L 21/266* (2013.01); *H01L 21/26513* (2013.01); *H01L 21/76897* (2013.01); *H01L 23/528* (2013.01); *H01L 29/0847* (2013.01); *H01L 29/40114* (2019.08); *H01L 29/513* (2013.01); *H01L 29/518* (2013.01); *H01L 29/6656* (2013.01); *H01L 29/66825* (2013.01); *H01L 29/7883* (2013.01)

(58) Field of Classification Search
CPC . H01L 29/42312–42344; H01L 29/788; H01L 29/7883; H01L 29/7839; H01L 29/806; H01L 29/78618; H01L 51/105; H01L 27/115; H01L 27/11517; H01L 27/11521; H01L 27/11524; H01L 27/11529; H01L 29/02; H01L 29/0843; H01L 29/0856; H01L 29/086; H01L 29/0865; H01L 27/10; H01L 27/105; H01L 27/1052; H01L 27/112–11226
See application file for complete search history.

(56) References Cited

U.S. PATENT DOCUMENTS 5,422,504 A * 6/1995 Chang .................. H01L 27/115
257/315
5,429,971 A * 7/1995 Yang .................... H01L 27/115
257/E21.682

(Continued)

*Primary Examiner* — Sonya McCall-Shepard
(74) *Attorney, Agent, or Firm* — Patterson Thuente Pedersen, P.A.

(57) ABSTRACT

A non-volatile memory array includes gate structures disposed on a substrate, each of the gate structures including a tunneling oxide layer positioned on the substrate, a floating gate positioned on the tunneling oxide layer and being arranged along a first direction on the tunneling oxide layer, sidewall gates disposed on sidewalls of the floating gate, extending in the first direction and being spaced apart from each other, and a gate dielectric layer interposed between the floating gate and the sidewall gates, bit lines disposed over the substrate, each extending in a second direction to intersect the sidewall gates, a drain region positioned in an upper portion of the substrate, the drain region overlapping, and being electrically connected to, the one of the bit lines, and a source line positioned between adjacent sidewall gates, the source line extending in the first direction and being buried in the substrate.

5 Claims, 4 Drawing Sheets

(51) Int. Cl.
*H01L 29/08* (2006.01)
*H01L 21/266* (2006.01)
*H01L 23/528* (2006.01)
*H01L 29/51* (2006.01)
*H01L 29/66* (2006.01)
*H01L 21/265* (2006.01)
*H01L 21/768* (2006.01)
*H01L 21/28* (2006.01)

(56) References Cited

U.S. PATENT DOCUMENTS

| | | | |
|---|---|---|---|
| 7,046,552 B2 * | 5/2006 | Chen | G11C 16/0425 257/314 |
| 2002/0008277 A1 * | 1/2002 | Chen | H01L 27/11521 257/315 |
| 2009/0134449 A1 * | 5/2009 | Arigane | G11C 16/3418 257/324 |
| 2011/0001179 A1 * | 1/2011 | Yanagi | G11C 16/0408 257/316 |
| 2016/0043097 A1 * | 2/2016 | Huang | H01L 27/11568 257/324 |

* cited by examiner

NON-VOLATILE MEMORY ARRAY

CROSS-REFERENCE TO RELATED APPLICATIONS

This application claims priority to Korean Patent Application No. 10-2018-0013240, filed on Feb. 2, 2018 and all the benefits accruing therefrom under 35 U.S.C. § 119, the contents of which are incorporated by reference in their entirety.

TECHNICAL FIELD

The present disclosure relates to a semiconductor device and a method of manufacturing the same. More particularly, the present disclosure relates to a non-volatile memory array and a method of manufacturing the non-volatile memory array.

BACKGROUND

Non-volatile memory devices are configured to store information in an electrically insulated storage. A non-volatile memory device is typically classified as a stack gate memory device, a split gate memory device, or an electrically erasable programmable read-only memory (EEPROM).

A conventional EEPROM includes a gate structure including a floating gate and a sidewall gate, a plurality of word lines extending in a row direction, and a pair of a bit line and a source line corresponding to the floating gate, extending in a column direction to cross the word lines. The bit lines and the source lines extend along the column direction and are spaced apart from each other. For example, the bit line and the source line may correspond to metal wires provided over a substrate, in parallel with each other.

Thus, contact plugs for connecting to the bit line and the source line may be required. Further, a spacer can also be required on the sidewalls of a sidewall gate in order to suppress mutual interferences between the sidewall gate and the contact plugs.

Therefore, the metal wires, the contact plugs for connection the metal wires and the spacers may occupy a large area of the substrate, which may cause an integration of the EEPROM to be difficult.

SUMMARY

The example embodiments of present disclosure provide a non-volatile memory array having an improved degree of integration.

The example embodiments of the present disclosure also provide a method of manufacturing a non-volatile memory array having an improved degree of integration.

According to an example embodiment of the present disclosure, a non-volatile memory array includes a plurality of gate structures disposed on a substrate, each of the gate structures including—a tunneling oxide layer positioned on the substrate, a plurality of floating gates positioned on the tunneling oxide layer each floating gate being arranged along a first direction on the tunneling oxide layer, sidewall gates disposed on sidewalls of the floating gate, extending in the first, and a gate dielectric layer interposed between the floating gate and the sidewall gates, the sidewall gates of each gate structure spaced apart from each other, a plurality of bit lines disposed over the substrate, each extending in a second direction to intersect the sidewall gate of each of the plurality of gate structures, a drain region positioned in an upper surface portion of the substrate, the drain region overlapping one of the bit lines and being electrically connected to the one of the bit lines, and a source line positioned between each pair of two adjacent sidewall gates, the source line extending in the first direction and being buried in the substrate.

In an example embodiment, each pair of two adjacent sidewall gates is arranged at least partially on the source line. In an example embodiment, the source line may include n-type conductivity dopants.

In an example embodiment, a first contact plug may be further configured to connect one of the bit lines to the drain region.

In an example embodiment, the gate dielectric layer may have an ONO structure having an oxide layer, a nitride layer and an oxide layer sequentially stacked on the floating gate.

In an example embodiment, each of the gate structures may further include spacers disposed on sidewalls of the sidewall gates.

According to an example embodiment of the present disclosure, a method of manufacturing a non-volatile memory array is provided. A tunneling oxide layer is formed on the substrate. After forming a plurality of floating gates spaced apart from each other on the tunneling oxide layer, and arranged in a plurality of rows each row extending along a first direction, a plurality of gate dielectric layers is formed to surround each of the floating gates, respectively. Next, a first ion implantation process is performed using the floating gates and the gate dielectric layer as masks to form a source line extending along the first direction, and being buried in the substrate. After forming sidewall gates positioned on the sidewalls each floating gate arranged along a row of the plurality of rows, each of the sidewall gates extending in the first direction and being configured to serve as a select gate, bit lines are formed over the substrate, each extending in a second direction to be positioned above the floating gate of each of the plurality of gate structures.

In an example embodiment, a second ion implantation process may be further performed using the floating gates and the sidewall gates as masks to form a low concentration ion implantation region between each adjacent pair of sidewall gates.

In an example embodiment, after further forming spacers on sidewalls of each of the sidewall gates, performing a third ion implantation process using the spacers and the sidewall gates as masks to form a drain region on the low concentration ion implantation region, a first contact plug extending vertically on the drain region may be further formed to be electrically connected to each of the bit lines In an example embodiment, the source line may include n-type dopants.

In an example embodiment, each pair of two adjacent sidewall gates may be arranged at least partially on the source line may be partially overlapped with the sidewall gates in a plan view.

In an example embodiment, forming the gate dielectric layer may include sequentially depositing an oxide thin film oxide, an nitride thin film and an oxide thin film to create an ONO structure.

As described above, according to the non-volatile memory array in accordance with embodiments of the present disclosure, the source lines extend in the first direction between the side wall gates, not in the second direction, which means that the source line extends along a direction perpendicular to that of the bit lines, and the source line is provided in a buried structure. Thus, the source line may not require an additional contact plug. Therefore, a high integration degree of the non-volatile memory array may be realized. Furthermore, spacers between the contact plugs and the sidewall gates may be omitted, so that the integration degree of the non-volatile memory array may be further realized.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures.

Figure 1:
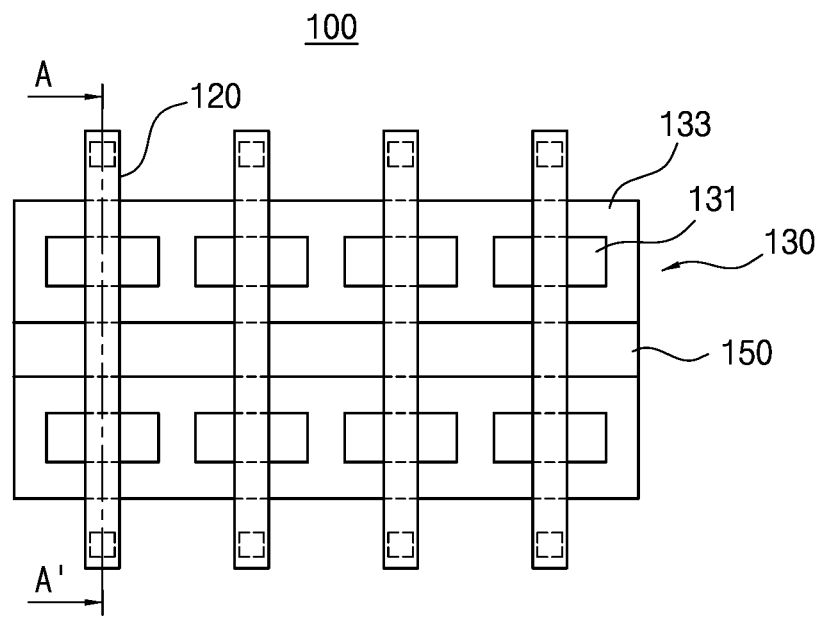
FIG. 1 is a plan view illustrating a non-volatile memory array in accordance with an example embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. In contrast, it will also be understood that when a layer, a layer, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present disclosure are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present disclosure. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

Figure 2:
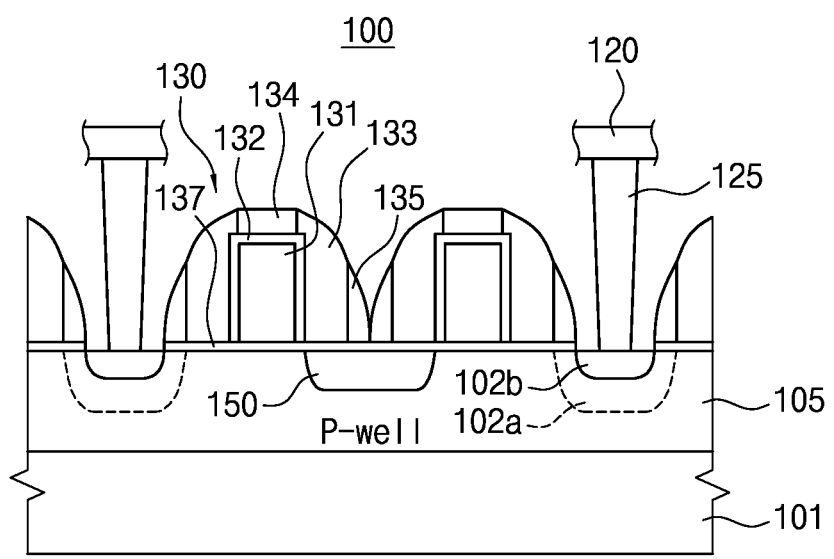
FIG. 2 is a cross sectional view taken along a line A-A' of FIG. 1.

FIG. 1 is a plan view illustrating a non-volatile memory array in accordance with an example embodiment of the present disclosure. FIG. 2 is a cross sectional view taken along a line A-A' of FIG. 1.

Referring to FIGS. 1 and 2, a non-volatile memory array 100 according to an example embodiment of the present disclosure includes a substrate 101, a plurality of gate structures 130, a plurality of bit lines 120, a drain region 102b (proximate a low concentration ion implantation region 102a) and a source line 150. Each gate structure 130 included in the non-volatile memory array 100 includes a select gate 133 positioned on a sidewall of a floating gate 131. Thus, the non-volatile memory array 100 may have a sidewall selective transistor cell structure. As a result, problems associated with conventional non-volatile memory arrays in which a selection transistor and a memory transistor are each provided at different regions of the substrate 101 and occupy a relatively large area making a high level of integration difficult to achieve, may be addressed.

The substrate 101 may include a silicon substrate having a first conductivity type. For example, the first conductivity type may be p-type. Therefore, the substrate 101 may be doped with impurities of a Group III element such as boron. An epitaxial layer 105 may be formed on the substrate 101 through an epitaxial growth process.

The gate structure 130 is disposed on the substrate 101. The gate structure 130 may be located in an active region of the substrate 101. The gate structure 130 may erase, write, or read data by storing charge therein or discharging charge therefrom.

The gate structure 130 includes a tunneling oxide layer 137, floating gates 131, a sidewall gate 133, and a gate dielectric layer 132. Here, both the sidewall gate and the select gate are denoted with the reference number of 133.

The tunneling oxide layer 137 is formed on the substrate 101. The tunneling oxide layer 137 is formed in the active region. The tunneling oxide layer 137 may include an oxide.

Charge may be transferred through the tunneling oxide layer 137 into the floating gate 131 or discharged from the floating gate 131 by Fowler-Nordheim tunneling phenomena.

The floating gates 131 are disposed on the tunneling oxide layer 137. The floating gates 131 are arranged along a first direction which defines a row direction. Further, the floating gates 131 are arranged in plural rows which are spaced apart from each other along a second direction perpendicular to the first direction, which defines a column direction. The floating gates 131 may include polysilicon.

The floating gates 131 maintain an electrically floating state, and charges may be stored in the floating gates 131 or may be discharged from the floating gates 131.

The sidewall gates 133 are arranged to surround the sidewalls of the floating gates 131. Each of the sidewall gates 133 may surround the sidewalls of the floating gates 131 in a row. The sidewall gates 133 extend along the first direction. That is, each of the sidewall gates 133 extends along the floating gates 131 which are arranged in the first direction.

The sidewall gate 133 may correspond to a word line. Thus, an amount of charges which can be charged in the floating gate 131 may be adjusted according to a voltage value applied to the sidewall gates 133.

The gate dielectric layer 132 is formed to cover the floating gates 131. That is, the gate dielectric layer 132 may be interposed between each of the floating gates 131 and the sidewall gates 133. Thus, the gate dielectric layer 132 may protect the floating gate 131.

The gate dielectric layer 132 may have an oxide-nitride-oxide (ONO) structure. Because gate dielectric layer 132 has a ONO structure, retention characteristics of the non-volatile memory array 100 may be improved and a reliability of the non-volatile memory array 100 may be secured. In other words, the gate dielectric layer 132 may have a stack structure in which an oxide layer, a nitride layer, and an oxide layer are sequentially stacked on the floating gate 131. Thus, the non-volatile memory array 100 may have a sufficient breakdown voltage when a coupling bias is applied to the floating gates 131 through the sidewall gates 133.

The bit lines 120 are disposed over the substrate 101. The bit lines 120 extend in the second direction to intersect the sidewall gates 133. For example, the bit lines 120 may extend in the second direction perpendicular to the first direction, which is the direction of extension of the sidewall gates 133.

The bit lines 120 correspond to metal wirings or wires, in embodiments. The bit lines 120 may be electrically connected to a drain region 102b which will be in detail described later. Accordingly, a drain voltage may be applied to the drain region 102b through the bit line 120.

The drain region 102b is disposed on an upper surface of the substrate 101. The drain region 102b is positioned to partially overlap the bit lines 120 in a plan view. The drain region 102b may have relatively high concentration of dopants, which may be formed by doping the upper surface of the substrate 101 with the dopants. The high-concentration of dopants may have a second conductivity type, for example, an n-type conductivity type. Accordingly, the high-concentration dopants may correspond to Group V elements such as phosphorus, arsenic, antimony, and the like.

The drain region 102b is electrically connected to the bit line 120. For example, the drain region 102b may be connected to the bit line 120 via a first contact plug 125.

The source line 150 extends between adjacent sidewall gates 133 along the first direction. The source line 150 is buried in the substrate 101. That is, the source line 150 has a buried junction type.

Meanwhile, the source line 150 may include dopants having a second conductivity type. In other words, the source line 150 may have a second conductivity type, for example, an n-type conductivity. Accordingly, the dopants may correspond to Group V elements such as phosphorus, arsenic, antimony, and the like.

When the source line 150 extends in parallel with the bit lines and is formed as a metal wiring structure over the substrate as in conventional devices the source line and the bit lines may be spaced apart from one another and occupy a significant area of the substrate. Further, because a plurality of contact plugs for connecting the source line and the bit line may be required, the contact plugs may be required to have a predetermined area. Further, when the contact plugs are formed, spacers may be additionally required between the contact plugs and the sidewall gates. Therefore, there has been a limitation in decreasing the pitch between the cells of conventional non-volatile memory arrays.

However, according to example embodiments of the present disclosure, the source line 150 extends in the first direction between the sidewall gates 133 rather than the second direction, which is the extending direction of the bit line 120, and the source line 150 is buried in the substrate 101. Thus, the source line 150 may not require an additional contact plug. As a result, a high integration of the non-volatile memory array 100 may be realized. Furthermore, because the spacer required between the contact plug and the sidewall gates may be omitted, the non-volatile memory array 100 may have further a high integration degree.

The source line 150 may be partially overlapped with the sidewall gate 133 in a plan view. Thus, charge may travel between the source line 150 and the sidewall gates 133 due to a tunneling effect which may occur between the source line 150 and the sidewall gates 133.

While each source line 150 is adjacent two sidewall gates 133, only one of the sidewall gates 133 adjacent to the source line 150 is controlled by the source line 150. For example, as arranged in FIG. 2, the source line 150 controls a left side one of two sidewall gates 133 adjacent to the source line 150 to serve as a select gate, whereas a right one of the sidewall gates 133 does not function as a select gate.

In an example embodiment of the present disclosure, a first contact plug 125 may be provided to electrically connect each of the bit lines 120 with the drain region 102b. The first contact plug 125 may be formed by filling, with a metal material, a penetration hole that penetrates through a pre-metal dielectric (PMD) layer (not shown) formed over the substrate 105 to cover the gate structure 130 as shown in FIG. 2.

In an example embodiment of the present disclosure, the gate structure 130 may further include spacers 135 on both sidewalls of each of the sidewall gates 133. Some of the spacers 135 may be disposed on the sidewalls of the sidewall gates 133, respectively, with respect to the source line 150. Further, others of the spacers 135 may be disposed on the other side of the sidewall gate 133 with respect to the first contact plug 125 interposed therebetween.

FIGS. 3 to 6 are cross sectional views illustrating a method of manufacturing a non-volatile memory array according to an example embodiment of the present disclosure.

Figure 3:
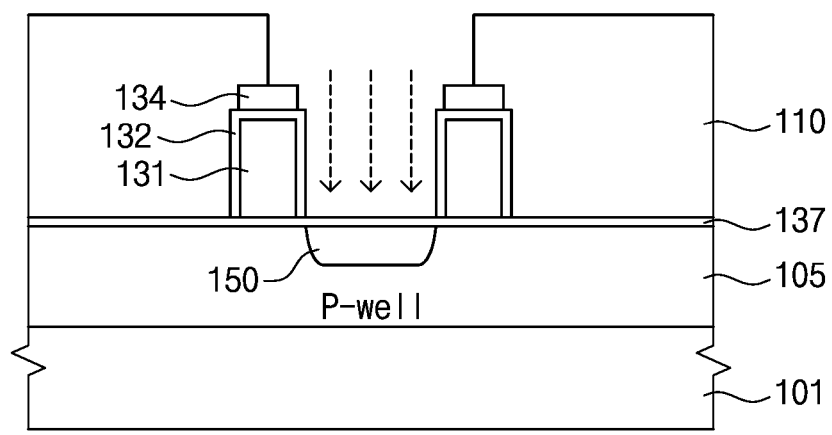
FIGS. 3 to 7 are cross sectional views illustrating a method of manufacturing a non-volatile memory array according to an example embodiment of the present disclosure.

Referring to FIG. 3, an isolation layer (not shown) is formed at an upper surface of a substrate 101 to define a plurality of active regions.

Then, a tunneling oxide layer 137 is formed on the substrate 101 and in each of the active regions. A floating gate conductive layer (not shown) is formed on the substrate 101 to cover the tunneling oxide layer 137. The floating gate conductive layer may be formed by forming a first polysilicon layer using polysilicon on the substrate 101 and implanting the first polysilicon layer with dopants to improve electric characteristics of the floating gate conductive layer. The first polysilicon layer is patterned to form floating gates 131 on the tunneling oxide layer 137. The floating gates 131 are isolated from each other. The floating gates 131 are spaced apart from each other and are arranged in a first direction.

Then, a preliminary gate dielectric layer (not shown) may be formed to cover the floating gates 131. The preliminary gate dielectric layer may be formed through a chemical vapor deposition process. The preliminary gate dielectric layer may have an Oxide-Nitride-Oxide (ONO) structure by sequentially forming an oxide layer, a nitride layer, and an oxide layer on tunneling oxide layer 137. Then, the preliminary gate dielectric layer is patterned to form the gate dielectric layer 132 to selectively cover the floating gates 131. Thus, the gate dielectric layer may help maintain a sufficient breakdown voltage when a coupling bias is applied to the floating gates 131 through sidewall gates 133 (see FIG. 2).

In order to pattern the preliminary gate dielectric layer to form a gate dielectric layer 132 on the sidewalls of the floating gate 131, an etch-back process may be performed. The gate dielectric layer 132 may be formed as a spacer along the sidewalls of the floating gates 131.

A first ion implantation process is performed using the gate dielectric layer 132 as a mask to form a source line 150 on the upper surface of the substrate 101. The gate dielectric layer 132 may serve as a mask and the source line 150 is self-aligned. The source line 150 is formed to extend along the first direction in which the floating gates 131 are arranged. The source line 150 may be formed using a second conductivity type, for example, an n-type dopant.

As depicted in the cross sectional plan view of FIG. 4, the source line 150 may partially overlap the sidewall gate 133 which is to be formed subsequently (see FIG. 4).

Before carrying out the first ion implantation process, a hard mask pattern 134 may be formed to cover upper portions of the floating gates 133. A gate dielectric layer 132 may be interposed between the hard mask pattern 134 and the floating gates 133 (see FIG. 4).

In addition, a mask pattern 110, for example, a photoresist pattern, may be additionally formed. Thus, the first ion implantation process may be performed using both the hard mask pattern 134 and the mask pattern 110 as masks.

Figure 4:
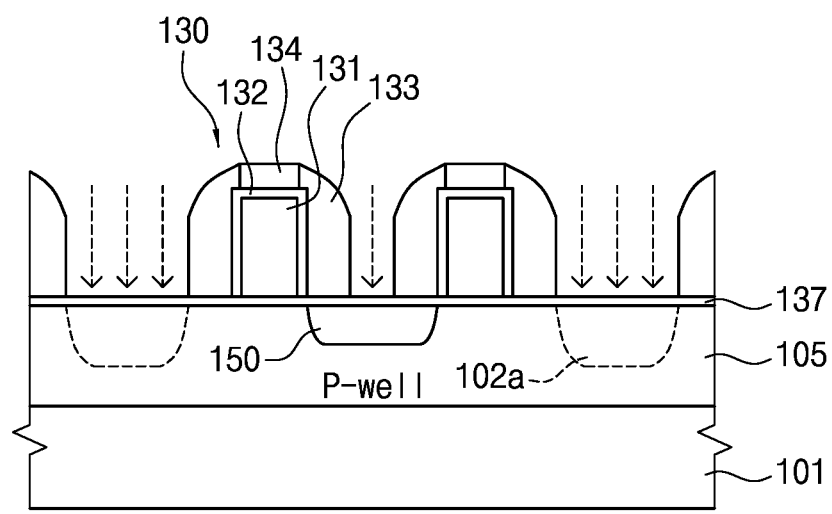

Referring to FIG. 4, sidewall gates 133, which extend in the first direction and function as select gates, are formed. The sidewall gates 133 are formed on the sidewalls of each of the floating gates 131.

In order to form the sidewall gates 133, after removing the photoresist pattern 110, a second polysilicon layer (not shown) may be formed to cover the sidewalls of the gate dielectric layer 132. Then, an anisotropic etching process may be performed against the second polysilicon layer to form the sidewall gates 133 on the sidewalls of the gate dielectric layer 132. The side wall gates 133 are formed to cover a plurality of the floating gates 131 arranged in a row along the first direction. At this time, each of the sidewall gates 133 extends along the first direction to cover the floating gates 131 which are arranged in one row. Thus, the gate structure 130 including the floating gates 131, the gate dielectric layer 132, and the sidewall gates 133 is formed.

Then, a second ion implantation process is performed using the gate structure 130 as a mask. As a result, a low concentration ion implantation region 102a is formed between the adjacent sidewall gates 133.

Figure 5:
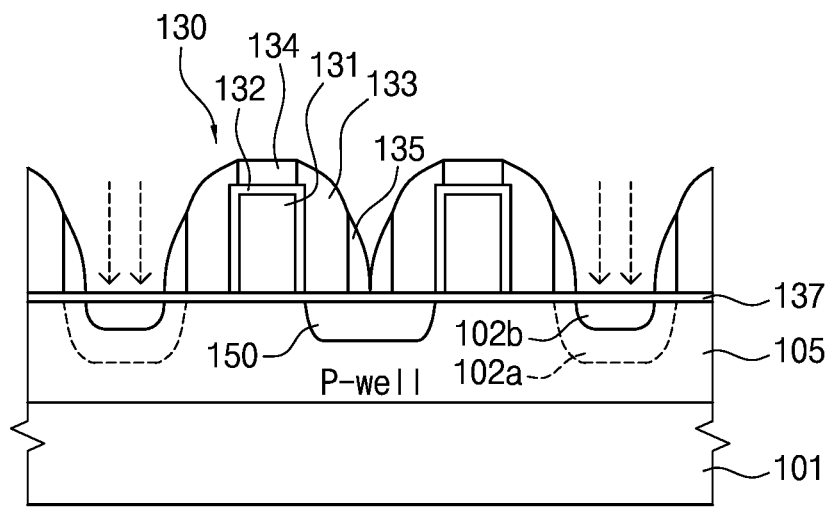

Referring to FIG. 5, spacers 135 are formed on sidewalls of the sidewall gates 133. More specifically, after entirely forming an insulating layer (not shown) on the upper surface of the substrate 101 having the sidewall gates 133, an anisotropic etching process is performed with respect to the insulating layer to form the spacers 135.

Next, a third ion implantation process using the gate structure 130 including the spacer 135 as a mask is performed to form a drain region 102b on the low concentration ion implantation region 102a.

Figure 6:
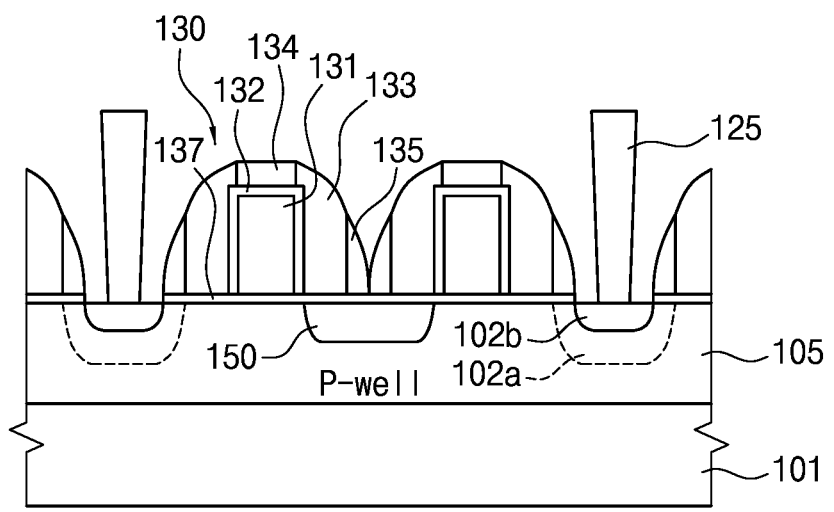

Referring to FIG. 6, a PMD layer (not shown) is formed to cover the entire surface of the substrate 101 including the floating gates 131, the sidewall gates 133, and the spacers 135. The PMD layer has a through hole which exposes an upper surface of the drain region 102b. The first contact plug 125 for filling the through hole is formed. The first contact plug 125 is formed to extend in a vertical direction so as to be electrically connected to the drain region 102b.

Figure 7:
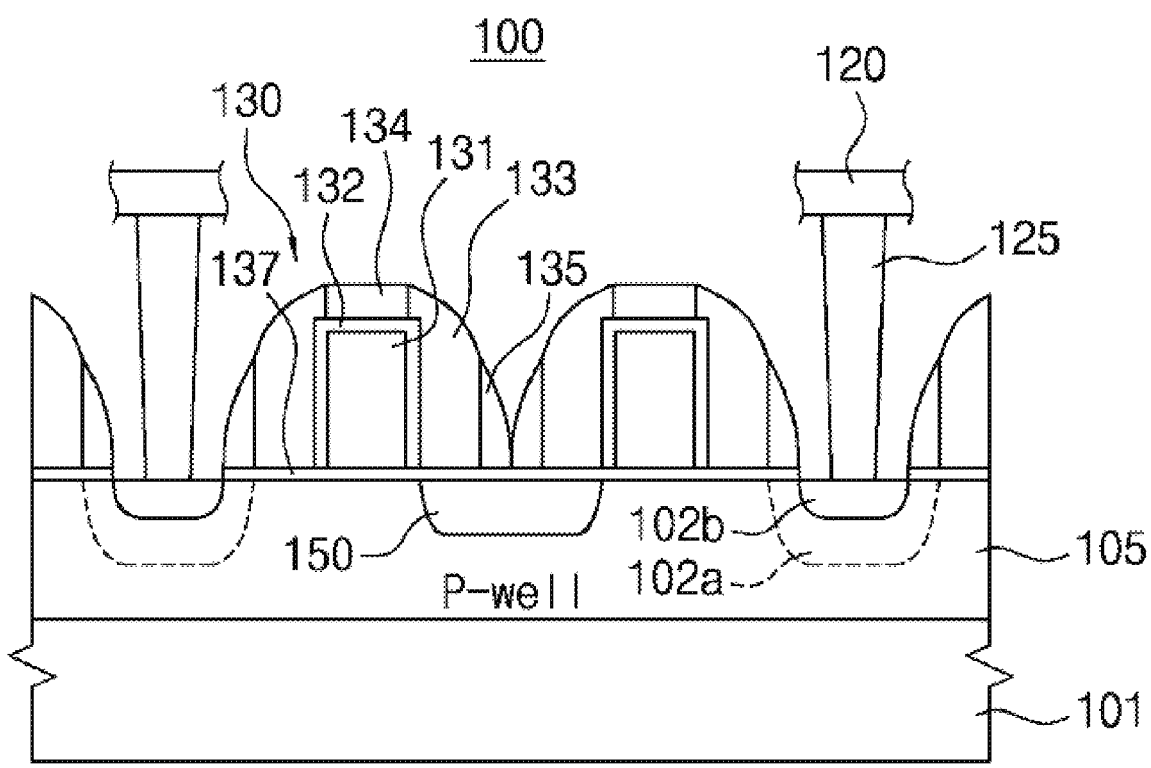

Referring to FIG. 7, a bit line 120 can be formed on the PMD layer and over the substrate 101. The bit line 120 extends in the second direction and is positioned between the sidewall gates 133 in a plan view.

Therefore, a non-volatile memory array including the substrate 101, the gate structure 130, the bit line 120, the drain region 102b and the source line 150 is manufactured.

Although the non-volatile memory array and the method of manufacturing the non-volatile memory have been described with reference to the specific embodiments, they are not limited thereto. Therefore, it will be readily understood by those skilled in the art that various modifications and changes can be made thereto without departing from the spirit and scope of the appended claims.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A non-volatile memory array comprising:
a plurality of gate structures disposed on a substrate such that each gate structure is a member of at least one pair of adjacent gate structures, each of the gate structures including
  a tunneling oxide layer positioned on the substrate,
  a plurality of floating gates positioned on the tunneling oxide layer, each floating gate being arranged along a first direction on the tunneling oxide layer,
  a sidewall gate extending in the first direction and disposed on sidewalls of the plurality of floating gates, and
  a gate dielectric layer interposed between the floating gate and the sidewall gates, the sidewall gates of each gate structure spaced apart from each other;
a plurality of bit lines disposed over the substrate, each extending in a second direction to intersect the sidewall gate of each of the plurality of gate structures;
a drain region positioned in an upper surface portion of the substrate, the drain region overlapping one of the bit lines and being electrically connected to the one of the bit lines; and
a source line positioned between the sidewall gates of each pair of adjacent gate structures, the source line extending in the first direction and being buried in the substrate,
wherein the sidewall gates of each pair of gate structures of the plurality of adjacent gate structures are arranged at least partially on the source line such that charge travels between the source line and the sidewall gates of the pair of adjacent gate structures due to a tunneling effect which occurs at the tunneling oxide layer interposed between the source line and the sidewall gates of the pair of gate structures.

2. The non-volatile memory array of claim 1, wherein the source line includes n-type conductivity dopants.

3. The non-volatile memory array of claim 1, further comprising a first contact plug configured to connect one of the bit lines to the drain region.

4. The non-volatile memory array of claim 1, wherein the gate dielectric layer has an ONO structure having an oxide layer, a nitride layer and an oxide layer sequentially stacked on the floating gates.

5. The non-volatile memory array of claim 1, wherein each of the gate structures further includes spacers disposed on sidewalls of the sidewall gates.

* * * * *